(12) United States Patent
Kang (10) Patent No.: US 7,994,627 B2
(45) Date of Patent: Aug. 9, 2011

(54) PAD REDISTRIBUTION CHIP FOR COMPACTNESS, METHOD OF MANUFACTURING THE SAME, AND STACKED PACKAGE USING THE SAME

(75) Inventor: Tae Min Kang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 33 days.

(21) Appl. No.: 12/622,614

(22) Filed: Nov. 20, 2009

(65) Prior Publication Data

US 2010/0065958 A1    Mar. 18, 2010

Related U.S. Application Data

(62) Division of application No. 11/322,901, filed on Dec. 30, 2005, now Pat. No. 7,642,632.

(30) Foreign Application Priority Data

Nov. 10, 2005   (KR) ........................ 10-2005-0107719

(51) Int. Cl.
    *H01L 23/02* (2006.01)
(52) U.S. Cl. . 257/686; 257/777; 257/786; 257/E25.006; 257/E25.013; 257/E25.018; 257/E25.021; 257/E25.027; 257/E23.085; 257/E23.015; 257/E23.02

(58) Field of Classification Search .................. 257/686, 257/777, 786, E25.006, E25.018, E25.021, 257/E25.027, E23.085, 772, 779–782, 784, 257/E23.015, E23.02
See application file for complete search history.

(56) References Cited

U.S. PATENT DOCUMENTS

5,854,508 A * 12/1998 Kajigaya et al. ............... 257/786
6,150,728 A * 11/2000 Tsukude et al. ............... 257/786
* cited by examiner

*Primary Examiner* — Jasmine J Clark
(74) *Attorney, Agent, or Firm* — Ladas & Parry LLP

(57) ABSTRACT

A substrate includes a substrate; a number of pad redistribution chips stacked on the substrate and on one another after being rotated 90° in a predetermined direction relative to one another, the pad redistribution chips having a number of center pads positioned at the center thereof, a number of (+) edge pads positioned on an end thereof while corresponding to those of the center pads lying in (+) direction from a middle center pad located in the middle of the center pads, a number of (−) edge pads positioned on the other end thereof while corresponding to those of the center pads lying in (−) direction with symmetry to those of the center pads lying in the (+) direction, and a number of traces for electrically connecting the center pads to the corresponding (±) edge pads, respectively; a flexible PCB for electrically connecting the substrate to the pad redistribution chips; and an anisotropic dielectric film for electrically connecting the pad redistribution chips to the flexible PCB and the substrate to the flexible PCB.

10 Claims, 14 Drawing Sheets

PAD REDISTRIBUTION CHIP FOR COMPACTNESS, METHOD OF MANUFACTURING THE SAME, AND STACKED PACKAGE USING THE SAME

BACKGROUND OF THE INVENTION

1. Field of the Invention

The present invention relates generally to a pad redistribution chip, a method for manufacturing the same, and a stacked package using the same, and more particularly to a stacked package, which has its pads redistributed on chips for compactness.

2. Description of the Prior Art

As generally known in the art, a semiconductor package has a number of chips (fabricated in a wafer process) that are electrically connected to each another in the package. The package is sealed and packaged so that it can be protected against external impact and used as an electronic product.

As the recent trend is to miniaturize the electronic products, the semiconductor components must be able to be mounted in a narrower space. In addition, as the electronic products increasingly involve more functions and higher performance characteristics, the type and number of the semiconductor components would increase accordingly. As a result, the semiconductor packages are also becoming more compact to increase the mounting efficiency per unit volume.

Moreover, the stacked packages have been developed such that it can arrange in a single package a number of semiconductor chips, each having different functions. This is done by stacking one type of chip(s) on different type of chip(s) mounted inside a package.

Figure 1A:
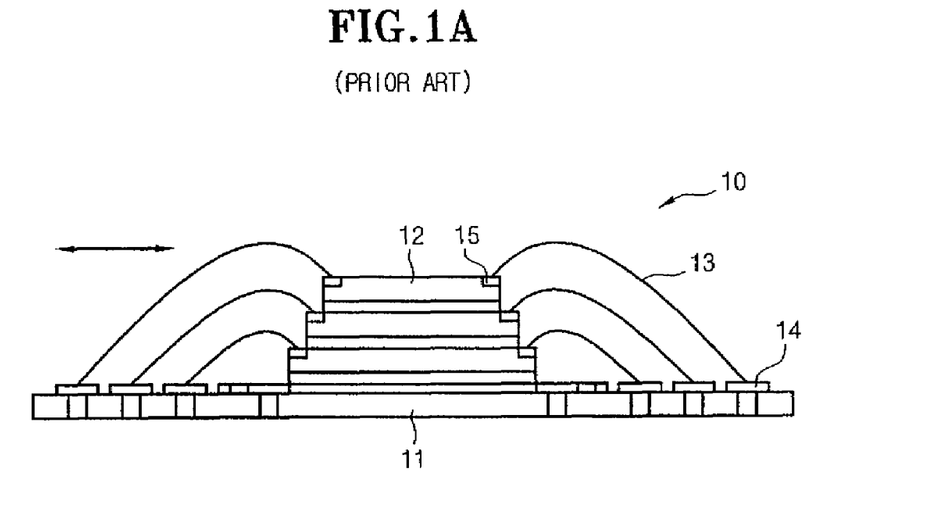
FIGS. 1a and 1b are cross-sectional views showing two example types of conventional stacked packages.
Figure 1B:
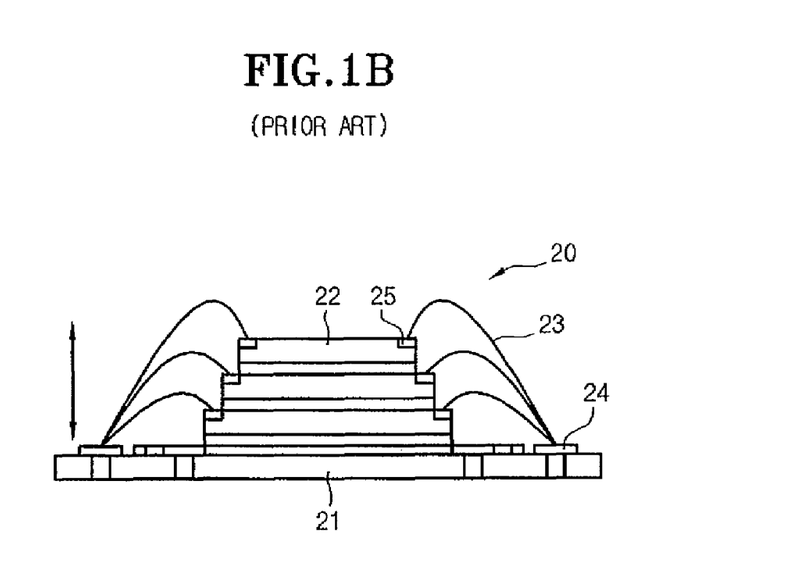

The general structure of the conventional stacked packages is shown in FIG. 1a or 1b.

Referring to the drawings, a stacked package 10 or 20 includes: a substrate 11 or 21 having substrate bonding pads 14 or 24 on both ends thereof; a number of chips 11 or 21 stacked on the substrate 11 or 21; and wires 13 and 23 for electrically connecting the substrate 11 or 21 to the chips 12 or 22.

Each chip in the stacked package 12 or 22 has chip bonding pads 15 or 25 positioned on both ends thereof, to which the wires 13 or 23 are bonded so that the chip bonding pads 15 or 25 are connected to the substrate bonding pads 14 or 24 on the substrate 11 or 21.

However, the stacked package 10 or 20 may malfunction if the wires 13 or 23 positioned therein interfere with one another.

In order to avoid interference between the wires 13 and/or 23, the conventional techniques suggest that a number of substrate bonding pads 14 are positioned on the substrate 11 to extend the wires 13 in the horizontal direction, as shown in FIG. 1a. Alternatively, the wires 23 are extended in the vertical direction to be connected to the substrate bonding pads 24, as shown in FIG. 1b.

However, wires extending in the horizontal or vertical direction to avoid interference between them occupy much space inside the package, in the horizontal and/or vertical directions. As a result, the package becomes bulky.

This is contrary to the current trend towards compactness of packages.

SUMMARY OF THE INVENTION

Accordingly, the present invention has been made to solve the above-mentioned problems occurring in the prior art, and an object of the present invention is to provide a chip designed to make a package compact, a method for manufacturing the same, and a stacked package using the same.

In order to accomplish this object, there is provided a pad redistribution chip including a wafer; a number of center pads positioned in at least one row at the center of the wafer; a number of (+) edge pads positioned on an end of the wafer while corresponding to those of the center pads lying in (+) direction from a middle center pad located in the middle of the center pads; a number of (−) edge pads positioned on the other end of the wafer while corresponding to those of the center pads lying in (−) direction from the middle center pad; and a number of traces for electrically connecting the center pads to the corresponding (±) edge pads, respectively.

In accordance with another aspect of the present invention, there is provided a method for manufacturing a pad redistribution chip including the steps of (1) providing a wafer having center pads and fuse boxes on both sides of the center pads, forming an insulation layer on the wafer while exposing the center pads and the fuse boxes, forming a dielectric layer on the insulation layer while covering the fuse boxes, and forming first seed metal on the insulation layer while covering the center pads and the dielectric layer; (2) coating parts of the first seed metal on top of the center pads and both corresponding ends of the first seed metal with photoresist; (3) forming a first plating layer in spaces defined by the photoresist; (4) removing the photoresist and forming a coating of solder mask in such a manner that pad holes are formed on both ends of the first plating layer, respectively; (5) forming second seed metal on the solder mask and in the pad holes; and (6) etching the second seed metal on the solder mask to flatten an upper surface of the second seed metal in the pad holes and an upper surface of the solder mask.

Preferably, the method further includes the steps of coating the first seed metal with photoresist in such a manner that bump holes are formed on four corners of the first seed metal, after step (1); forming a first plating layer in the bump holes; removing the photoresist and etching the first seed metal exposed by moving the photoresist; coating the insulation layer exposed by etching the first seed metal with a solder mask in such a manner that the solder mask is higher than the first plating layer; forming second seed metal on the first plating layer and the solder mask; coating the second seed metal with photoresist to extend the bump holes; forming a second plating layer in the extended bump holes; removing the photoresist on the second seed metal and etching the second metal exposed by removing the photoresist; and shaping the second plating layer into circular bumps.

In accordance with another aspect of the present invention, there is provided a stacked package including a substrate; a number of pad redistribution chips stacked on the substrate and on one another after being rotated 90° in a predetermined direction relative to one another, the pad redistribution chips having a number of center pads positioned in at least one row at the center thereof, a number of (+) edge pads positioned on an end thereof while corresponding to those of the center pads lying in (+) direction from a middle center pad located in the middle of the center pads, a number of (−) edge pads positioned on the other end thereof while corresponding to those of the center pads lying in (−) direction with symmetry to those of the center pads lying in the (+) direction, and a number of traces for electrically connecting the center pads to the corresponding (±) edge pads, respectively; a flexible PCB for electrically connecting the substrate to the pad redistribution chips; and an anisotropic dielectric film for electrically connecting the pad redistribution chips to the flexible PCB and the substrate to the flexible PCB.

Preferably, the center pads have the same direction as the (±) edge pads on each of the stacked pad redistribution chips belonging to an odd-numbered layer.

Preferably, the center pads of each of the stacked pad redistribution chips belonging to an odd-numbered layer are perpendicular to the center pads of each of the stacked pad redistribution chips belong to an even-numbered layer.

Preferably, the anisotropic dielectric film has an L-shaped configuration with contact pads positioned on horizontal and vertical portions thereof, respectively.

Preferably, the anisotropic dielectric film is attached to corners of the pad redistribution chips in such a manner that the contact pad on the horizontal portion contacts the (±) edge pads and the contact pad on the vertical portion is coupled to the flexible PCB.

Preferably, coupling between the anisotropic dielectric film and the flexible PCB is based on thermal compression.

Preferably, the contact pad on the horizontal portion of the anisotropic dielectric film contacts the (±) edge pads, and the contact pad on the vertical portion thereof is coupled to the flexible PCB, the flexible PCB being attached to lateral surfaces of the pad redistribution chips and interposed between the vertical portion and the pad redistribution chips.

Preferably, coupling between the anisotropic dielectric film and the flexible PCB is based on thermal compression.

Preferably, a dummy bump is positioned between each of the stacked pad redistribution chips.

In accordance with another aspect of the present invention, there is provided a stacked package including a substrate; a first pad redistribution chip stacked on the substrate and having a number of center pads positioned in Y-axis direction, a number of (+) edge pads positioned on an end of the first pad redistribution chip while being connected to those of the center pads lying in (+) direction from a middle center pad located in the middle of the center pads, and a number of (−) edge pads positioned on the other end thereof while being connected to those of the center pads positioned in (−) direction from the middle center pad; a second pad redistribution chip having the same structure as the first pad redistribution chip and stacked on the first pad redistribution chip after being rotated 90° relative to the first pad redistribution chip; a third pad redistribution chip having the same structure as the first pad redistribution chip and stacked on the second pad redistribution chip after being rotated 90° relative to the second pad redistribution chip; a fourth pad redistribution chip having the same structure as the first pad redistribution chip and stacked on the third pad redistribution chip after being rotated 90° relative to the third pad redistribution chip; a flexible PCB for electrically connecting the first and third pad redistribution chips to the substrate, as well as the second and fourth pad redistribution chips to the substrate; an anisotropic dielectric film interposed between the first, second, third, and fourth pad redistribution chips and the flexible PCB to electrically connect the first, second, third, and fourth pad redistribution chips to the flexible PCB; and dummy bumps for providing a space between each of the stacked first, second, third, and fourth pad redistribution chips.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 2:
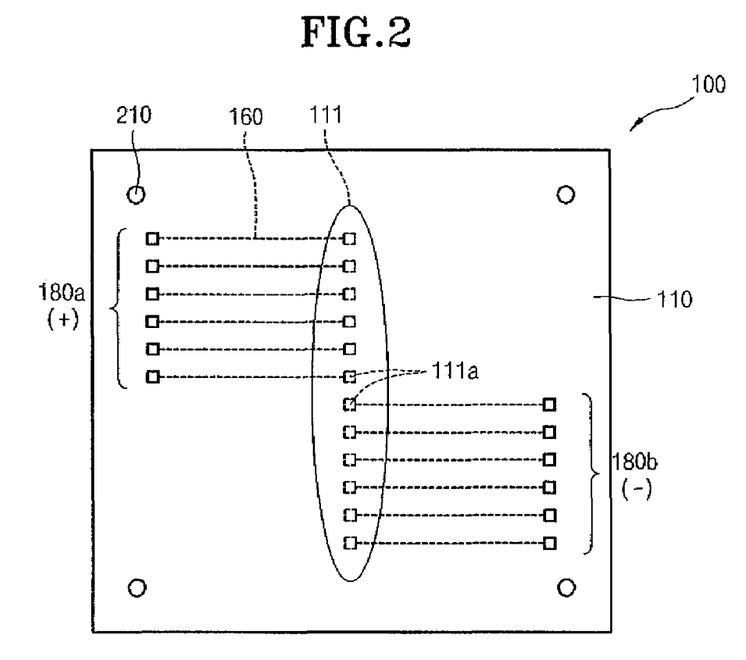
FIG. 2 is a top view showing a pad redistribution chip according to an embodiment of the present invention.

FIG. 2 is a top view showing a pad redistribution chip according to an embodiment of the present invention.

Referring to the drawing, the pad redistribution chip 100 includes a number of center pads 111 positioned in a row at the center of a wafer 110, a number of (+) edge pads 180a positioned on an end of the wafer 110 while corresponding to those of the center pads 111 lying in the (+) direction from their middle center pad 111a (i.e. one of the center pads 111 which is located at their middle), and a number of (−) edge pads 180b positioned on the other end of the wafer 110 while corresponding to those of the center pads 111 positioned in the (−) direction. In FIG. 2 (as well as in FIGS. 3-4), the (+) direction is the direction left of the vertical row of the center pads 111, and the (−) direction is the direction right of the vertical row of the center pads 111.

The center pads 111 are electrically connected to the corresponding (±) edge pads 180a and 180b by corresponding traces 160.

The pad redistribution chip 100 may have dummy bumps 210 positioned on its four corners to secure a space when the chip 100 is stacked on another chip.

Figure 3:
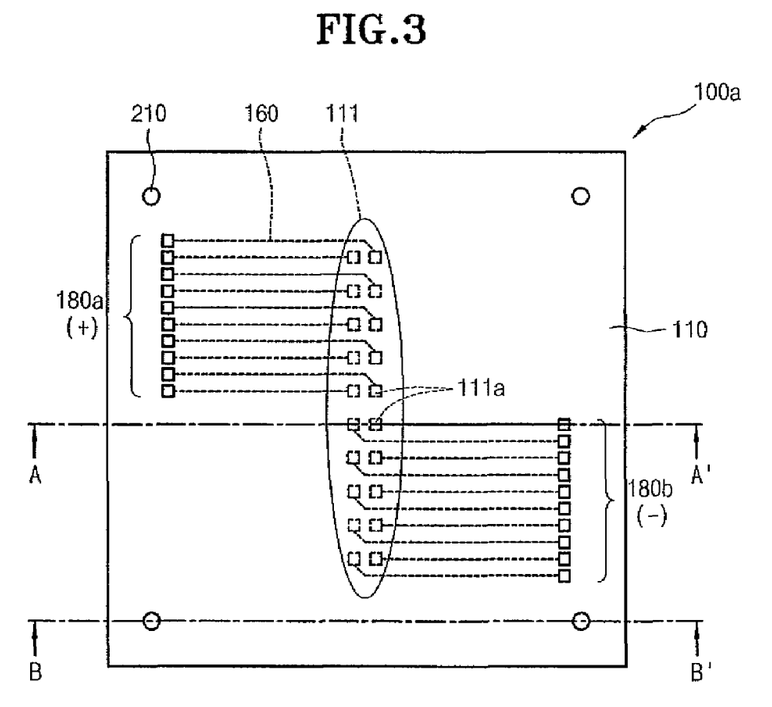
FIG. 3 is a top view showing a pad redistribution chip according to another embodiment of the present invention.

Alternatively, the pad redistribution chip 100 may have two rows of center pads 111, as shown in FIG. 3, in such a manner that those of the center pads 111 lying in the (+) direction from their middle center pad 111a are connected to the (+) edge pads 180a and those of the center pads 111 lying in the (−) direction from their middle center pad 111a are connected to the (−) edge pads 180b.

Figure 4:
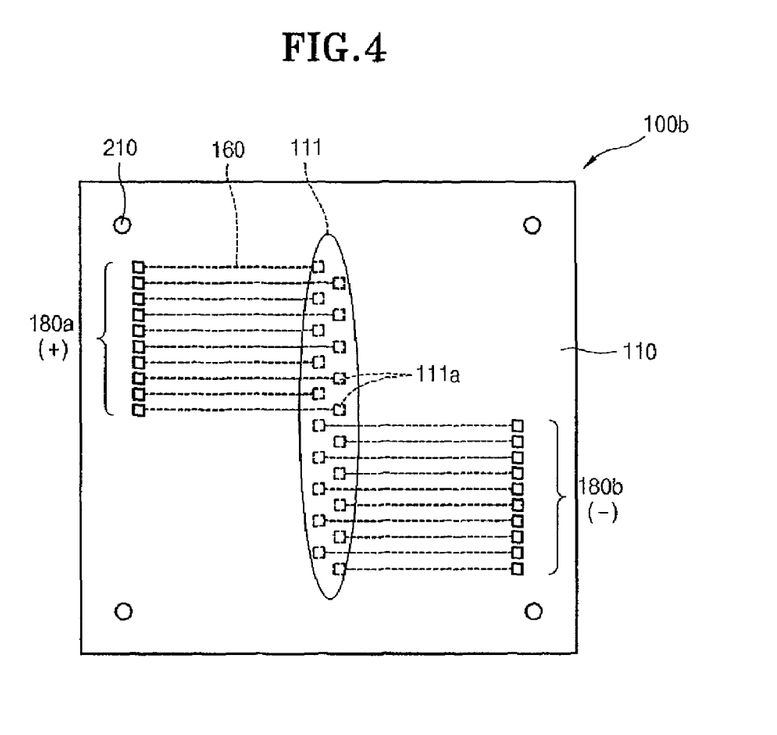
FIG. 4 is a top view showing a pad redistribution chip according to yet another embodiment of the present invention.

Although the center pads 111 are shown in FIGS. 2 and 3 to be arranged in a row and in two rows, respectively, their arrangement is not limited just to that shown in FIGS. 2-3 in the present invention. For example, the center pads 111 may be arranged in two alternating rows, as shown in FIG. 4, while being connected to the edge pads 180a or 180b in the same or similar manner as FIGS. 2 and 3. In addition, the center pads 111 may be arranged in more than two rows, and other similar arrangement of the center pads 111 is also possible.

A process for manufacturing the pad redistribution chip 100 will now be described. In the following description, it will be assumed that the pad redistribution chip 100 has the same center pad structure as shown in FIG. 3. FIGS. 5a-5f are cross-sectional views taken along the line A-A' in FIG. 3.

Figure 5A:
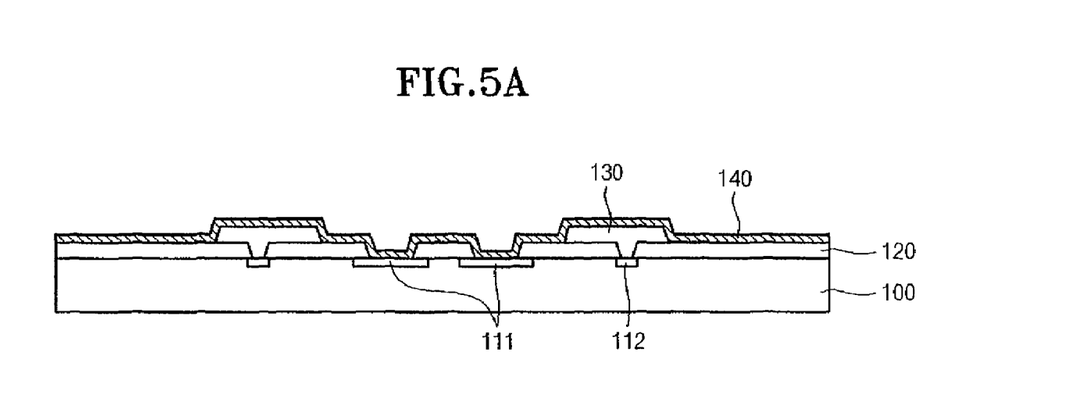
FIGS. 5a to 5f are cross-sectional views taken along the line A-A' in FIG. 3 and showing a series of steps of manufacturing the pad redistribution chip shown in FIG. 3.

As shown in FIG. 5a, a wafer 110 has a number of pairs of center pads 111 positioned at the center of the wafer 110, and fuse boxes 112 are positioned on the outer sides of the center pads 111. An insulation layer 120 is formed on the wafer 110 while exposing the center pads 111 and the fuse boxes 112. A dielectric layer 130 is formed on the insulation layer 120 while covering the fuse boxes 112. First seed metal 140 is formed on the insulation layer 120 using a conductive material, such as copper, while covering the center pads 111 and the dielectric layer 130.

Figure 5B:
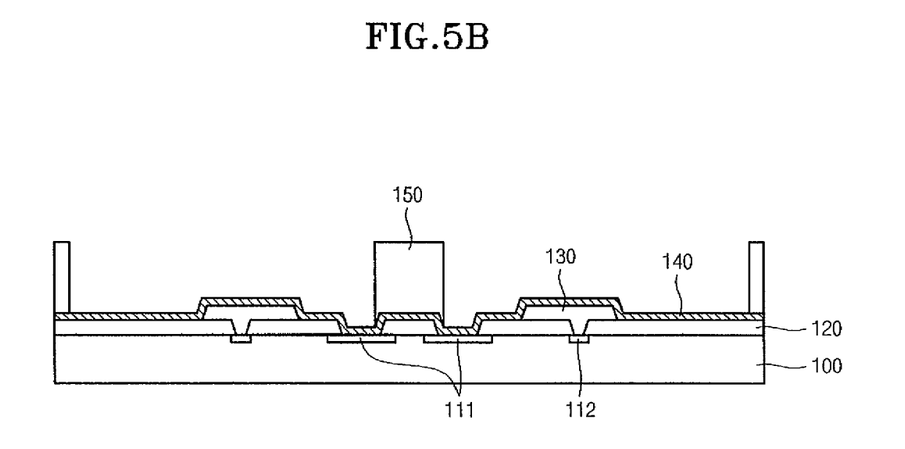

The first seed metal 140 is coated with photoresist (hereinafter referred to as "the PR") 150, now referring to FIG. 5b. The first metal 140 is then exposed to light and developed into a predetermined shape so that the PR 150 remains on top of the center pads 111 and on both ends of the first seed metal 140, as shown in FIG. 5b.

Figure 5C:
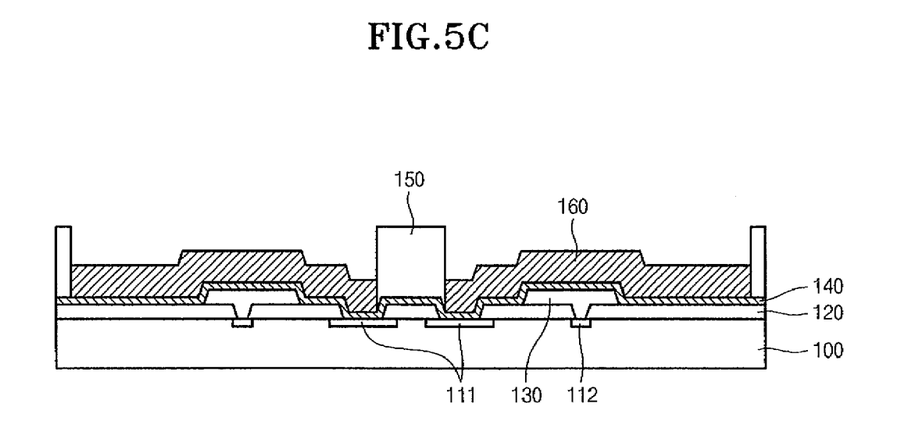

A first plating layer 160 is formed in spaces delimited by portions of the PR 150 remaining on top of the center pads 111 and on both ends of the first seed metal 140, respectively, as shown in FIG. 5c. The first plating layer 160 acts as the leads for electrically connecting the center pads 111 to edge pads 180 (described later). Particularly, the first plating layer 160 corresponds to each one of the traces 160 shown in FIG. 3.

Figure 5D:
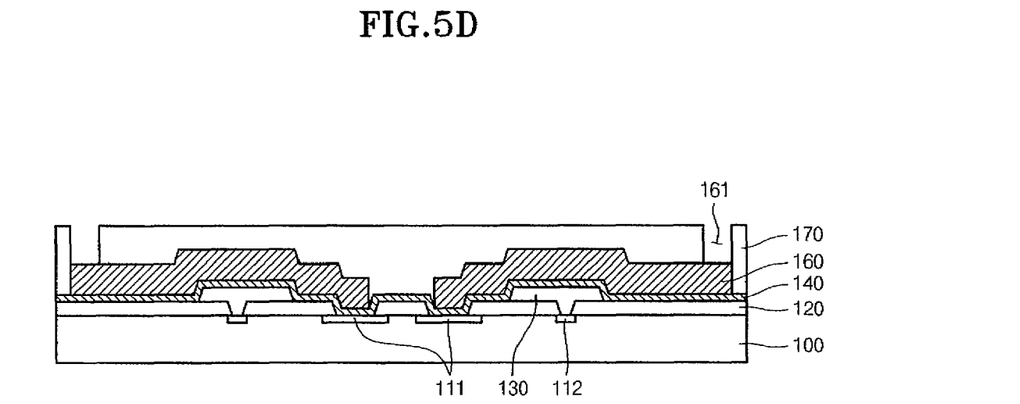

The PR 150 is removed, and while referring to FIG. 5d the parts exposed to the exterior are coated with a solder mask 170 to expose them to light and develop them so that pad holes 161 are formed on both ends of the first plating layer 160, as shown in FIG. 5d.

Figure 5E:
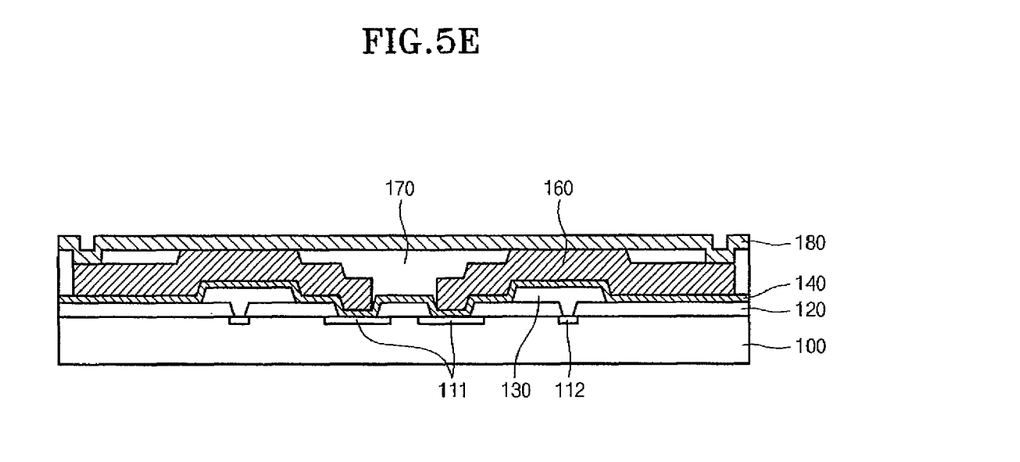

The solder mask 170 is etched up to a predetermined height, and the second seed metal 180 is formed on the solder mask 170 and the pad holes 161, as shown in FIG. 5e.

Figure 5F:
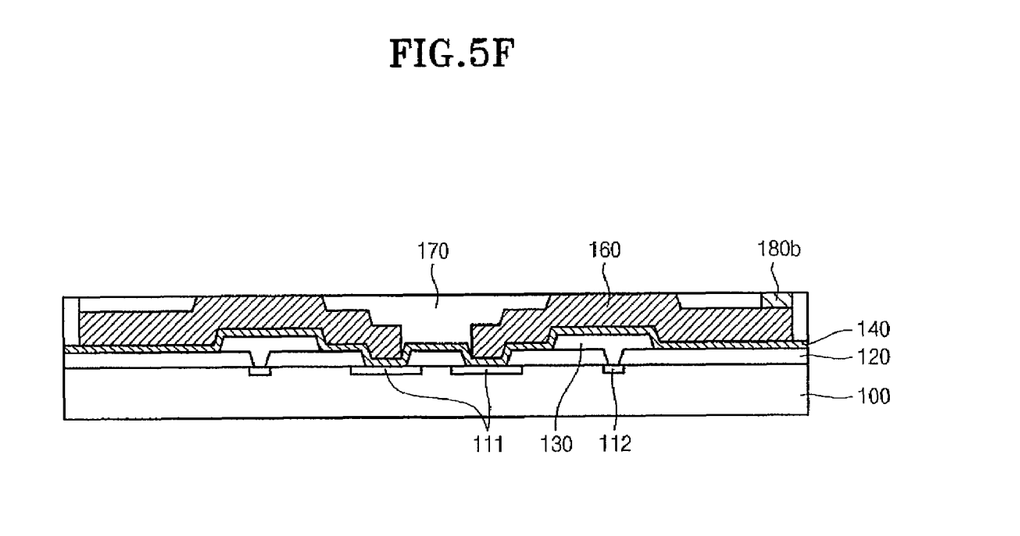

Referring to FIG. 5f, the second seed metal 180 is etched while only leaving parts of it inside the pad holes 161, so that upper surfaces of the second seed metal 180 and the solder mask 170 flat become flat, as shown in FIG. 5f. The parts of the second seed metal 180 remaining in the pad holes 161 correspond to the edge pads 180 shown in FIG. 3.

In order to manufacture a stacked package (described later) using the pad redistribution chips 100 as shown in FIG. 3, the following processes are also performed.

It is to be noted that the four ends 210 of the chip 100 (see FIG. 3) are simultaneously formed together with the central portion including 180a, 180b, 111, 160, etc. thereof the redistribution chip 100 as described above with respect to FIGS. 5a-5f.

Figure 6A:
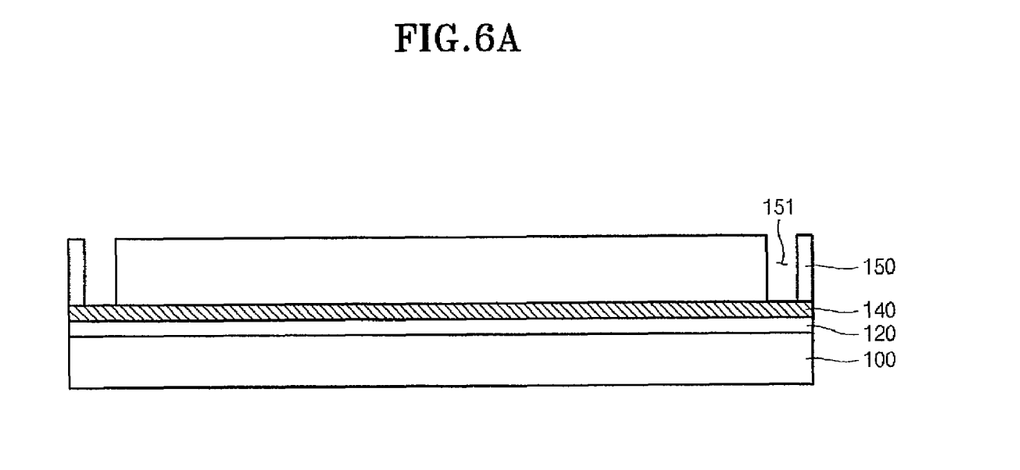
FIGS. 6a to 6i are cross-sectional views taken along the line B-B' in FIG. 3 and showing a series of steps of manufacturing a dummy bump of the pad redistribution chip shown in FIG. 3.

FIGS. 6a to 6i are cross-sectional views taken along the line B-B' in FIG. 3 and showing a series of steps of manufacturing a dummy bump of the pad redistribution chip shown in FIG. 3. The process goes on in the same manner as above until the step shown in FIG. 5a. The first seed metal 140 is coated with PR 150 with a predetermined height to form bump holes 151 on both ends of the first seed metal 140, as shown in FIG. 5a. FIG. 6a shows a cross-sectional view taken along the line B-B' shown in FIG. 3.

Considering the overall shape of the first seed metal 140, however, it can be stated that the first seed metal 140 is coated with the PR 150 in such a manner that four bump holes 151 (FIG. 6a) are formed on the four corners corresponding to the bumps 210 shown in FIG. 3.

Figure 6B:
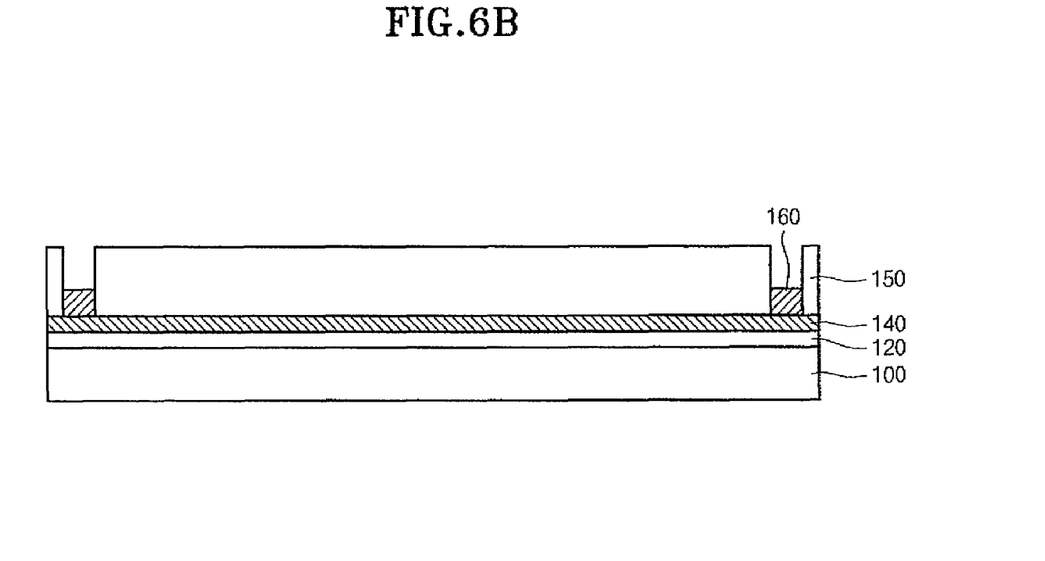
Figure 6C:
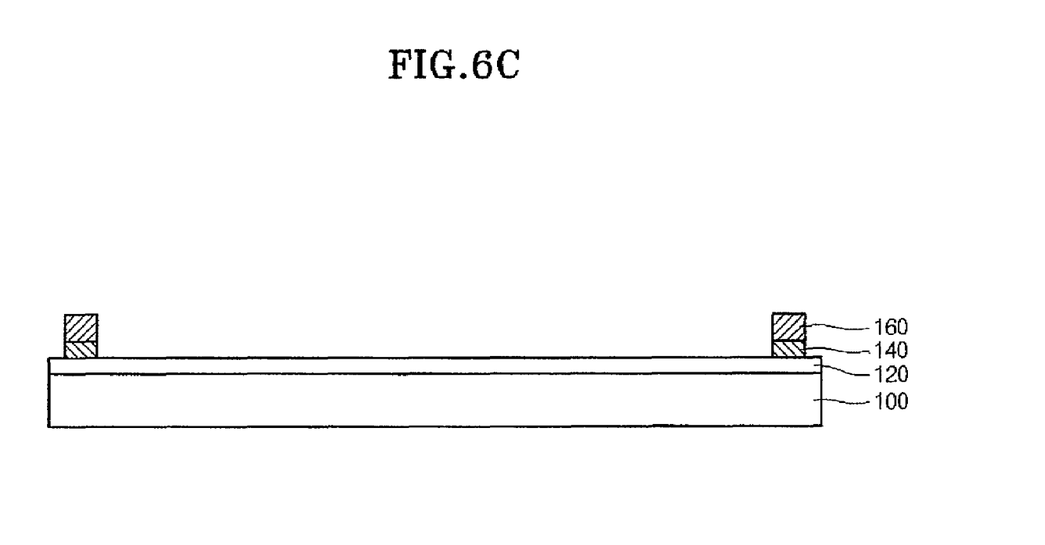

A first plating layer 160 is formed in the bump holes 151, as shown in FIG. 6b. The PR 150 is removed to expose the first seed metal 130, which is then etched, as shown in FIG. 6c.

Figure 6D:
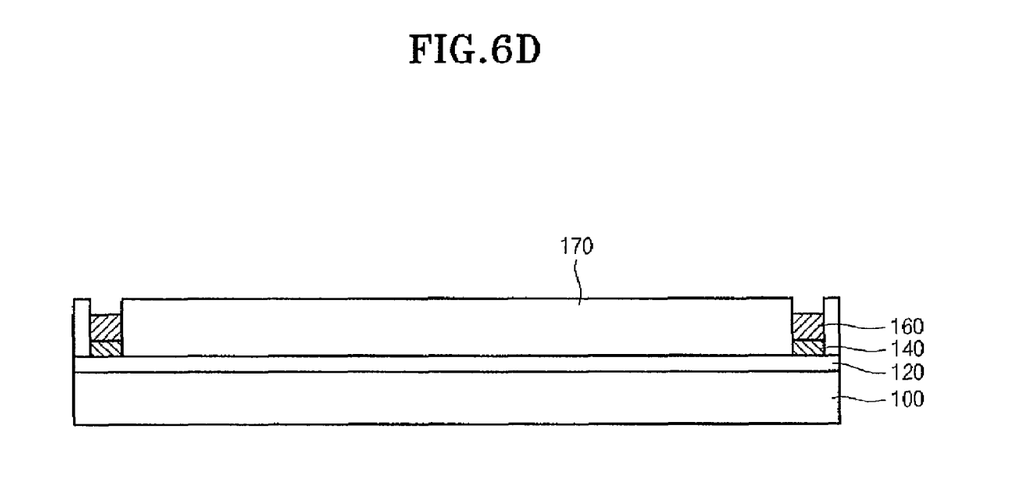
Figure 6E:
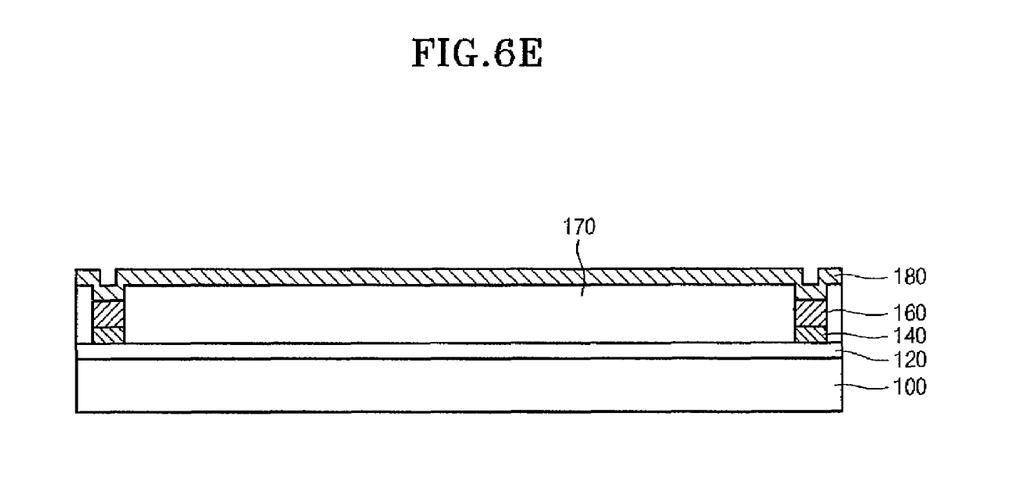

The insulation layer 120, which has been exposed by removing the PR 150, is coated with a solder mask 170 up to a height larger than that of the first plating layer 160, as shown in FIG. 6d. Second seed metal 180 is formed on the solder mask 170 and the first plating layer 160, as shown in FIG. 6e.

Figure 6F:
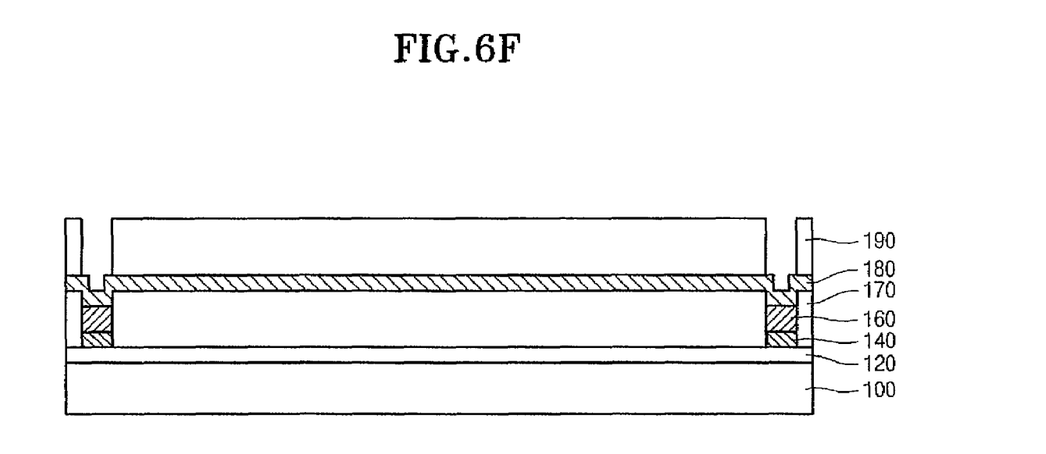
Figure 6G:
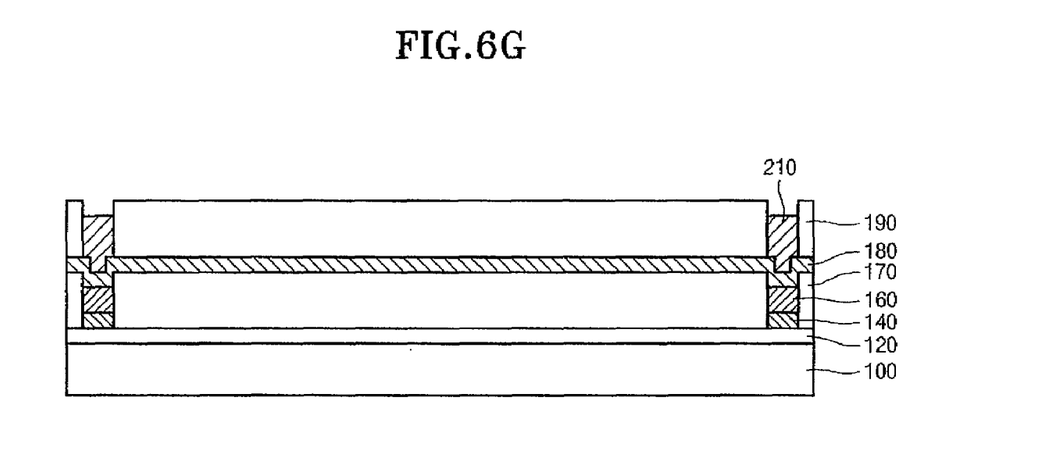

The second seed metal 180 is coated with PR 190 so that the bump holes 151 are extended, as shown in FIG. 6f. A second plating layer 210 is formed on the extended bump holes 151, as shown in FIG. 6g.

Figure 6H:
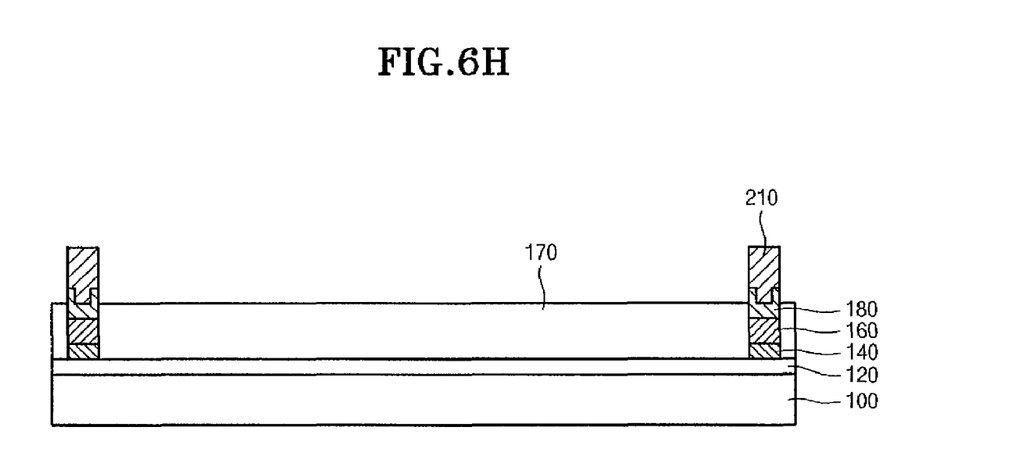

The PR 190 is removed, as shown in FIG. 6h, and the portions of the second seed metal 180 exposed over the solder mask 170 is removed together with the PR 150.

Figure 6I:
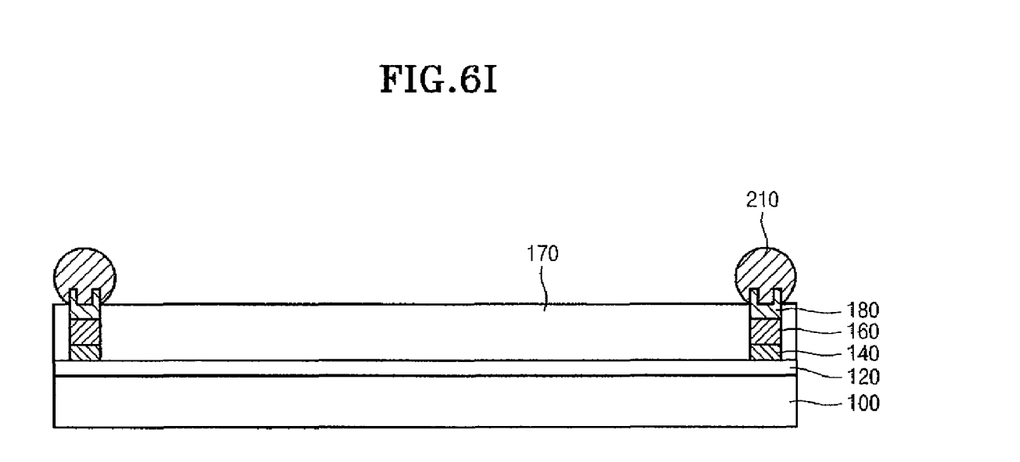

Finally, the plating liquid constituting the second plating layer 210 is caused to reflow so that the second plating layer 210 has a circular shape, as shown in FIG. 6i.

It is to be noted that the same components in FIGS. 6a to 6i as in FIGS. 5a to 5f are formed in the same corresponding steps.

Figure 7:
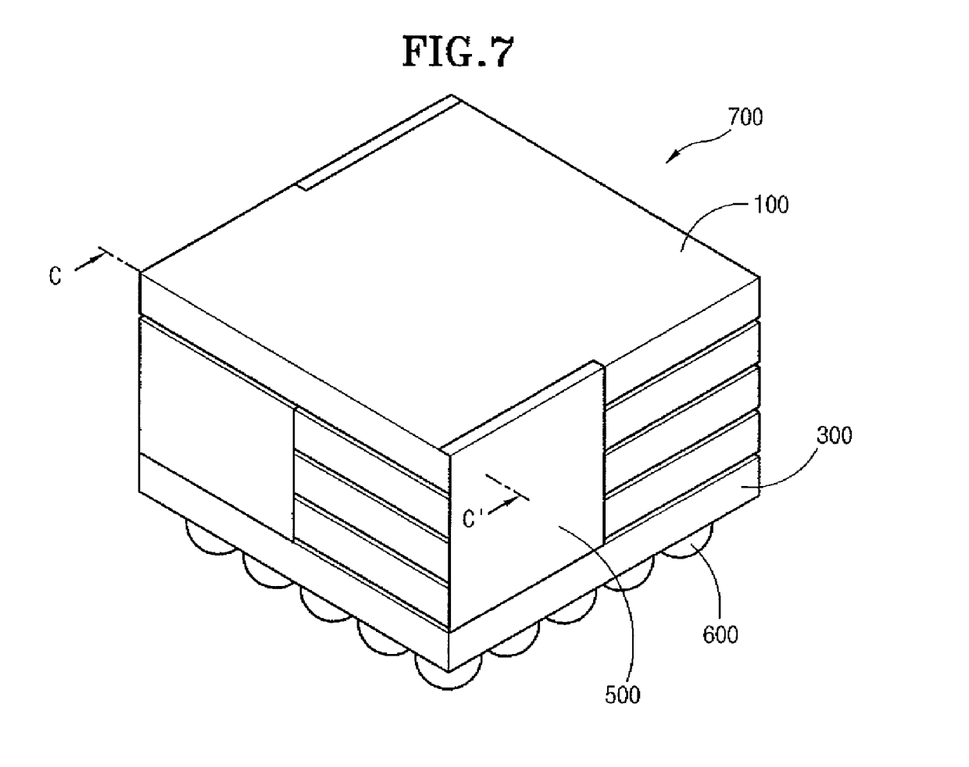
FIG. 7 is a perspective view showing a stacked package including the pad redistribution chip shown in FIG. 3.
Figure 8:
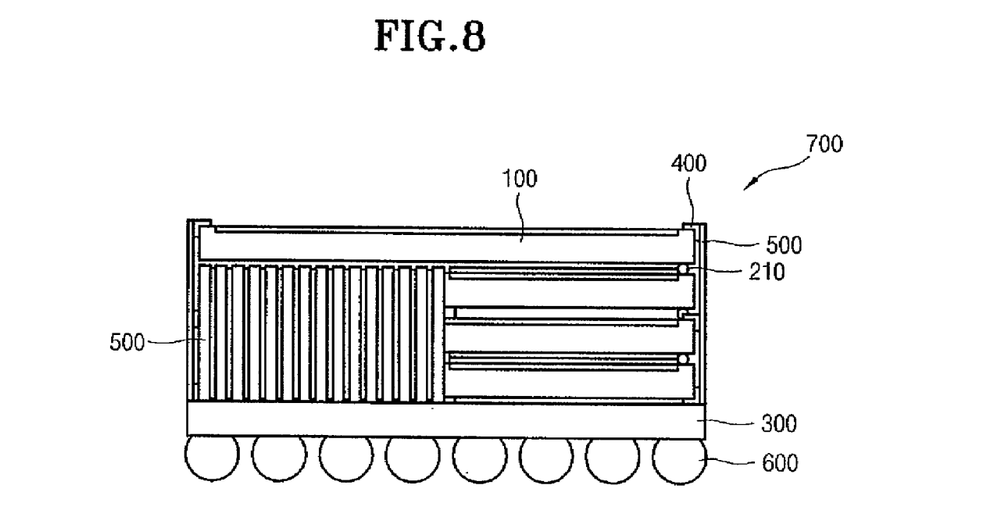
FIG. 8 is a cross-sectional view of the stacked package taken along the line C-C' shown in FIG. 7.

FIG. 7 is a perspective view showing a stacked package 700 according to an embodiment of the present invention, and FIG. 8 is a cross-sectional view taken along the line C-C' of the stacked package 700 shown in FIG. 7.

Referring to the drawings, the stacked package 700 includes: a substrate 300 having solder balls 600 coupled to a bottom side thereof; a number of pad redistribution chips 100 stacked on the substrate 300; and an anisotropic dielectric film 400 and a flexible PCB 500 coupled to lateral surfaces of the substrate 300 and the pad redistribution chips 100 to electrically connect the substrate 300 to the pad redistribution chips 100.

The pad redistribution chips 100 include a number of center pads 111 positioned at the center thereof, a number of (+) edge pads 180 positioned on an end thereof while corresponding to those of the center pads 111 lying in the (+) direction from their middle center pad 111a one by one, and a number of (−) edge pads 180 positioned on the other end thereof while corresponding to those of the center pads 111 positioned in the (−) direction (i.e. which are symmetric to those of the center pads 111 lying in the (+) direction) one by one.

Particularly, the (±) edge pads 180 are positioned in the two corner quadrants in the diagonal direction about the middle center pad 111a (for example, see the group of 180a(+) lines and the group of 180b(−) lines in FIGS. 2-4).

The center pads 111 are electrically connected to the corresponding (±) edge pads 180 by traces 160 made of a conductive material, such as copper.

Each pad redistribution chip 100 is rotated 90° in a predetermined direction when stacked on the substrate 300.

Particularly, the center pads 111 of adjacent pad redistribution chips 100 are perpendicular to each other, so that the (±) edge pads 180 do not overlap the traces 160.

Figure 9A:
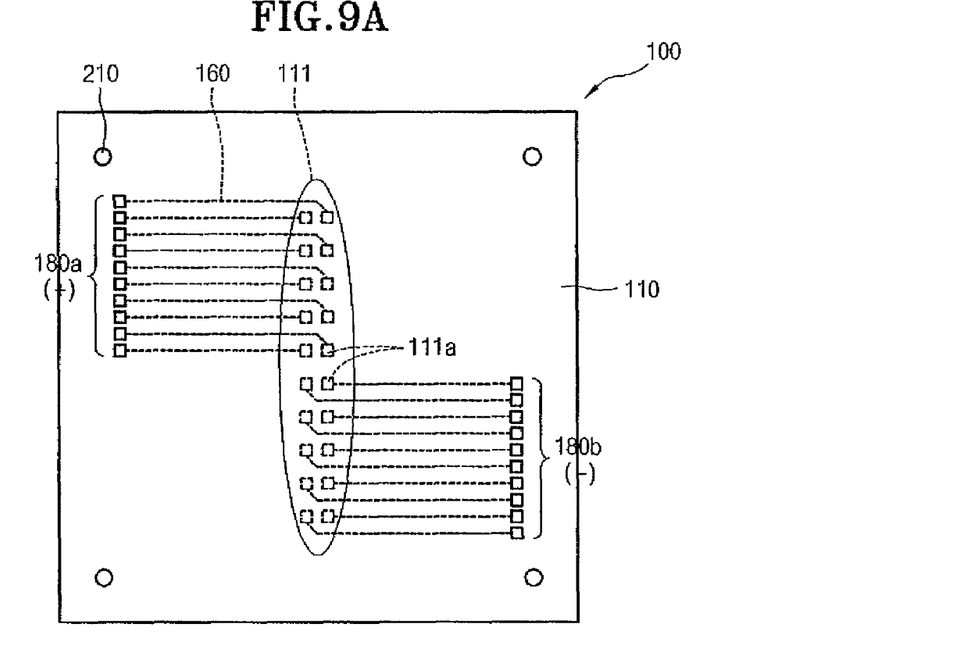
FIGS. 9a to 9d are top views showing methods of stacking pad redistribution chips on the stacked package shown in FIG. 7.
Figure 9B:
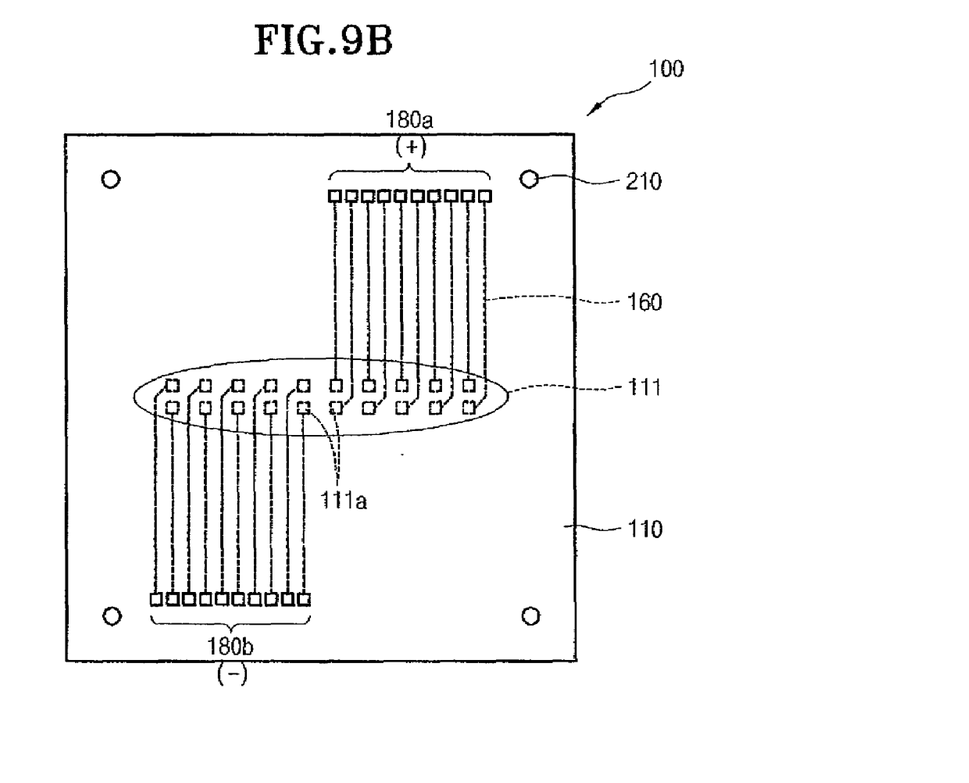
Figure 9C:
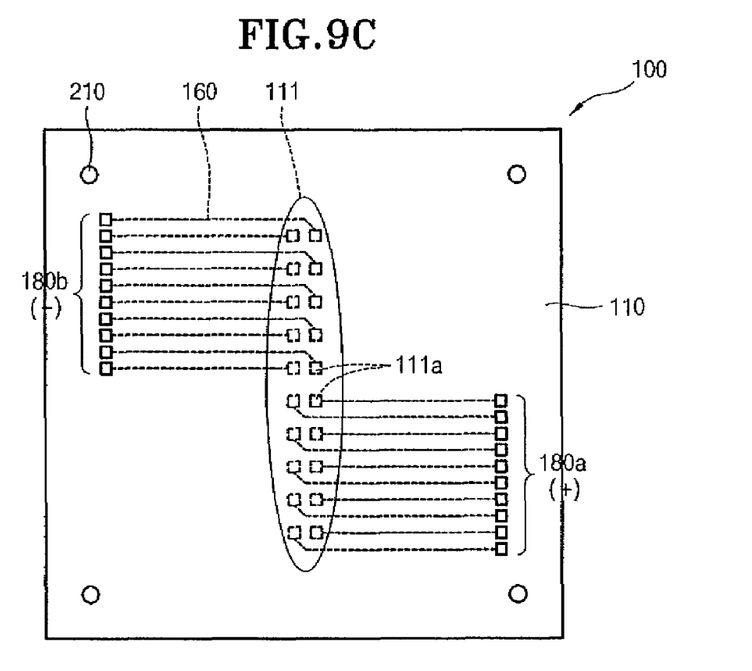
Figure 9D:
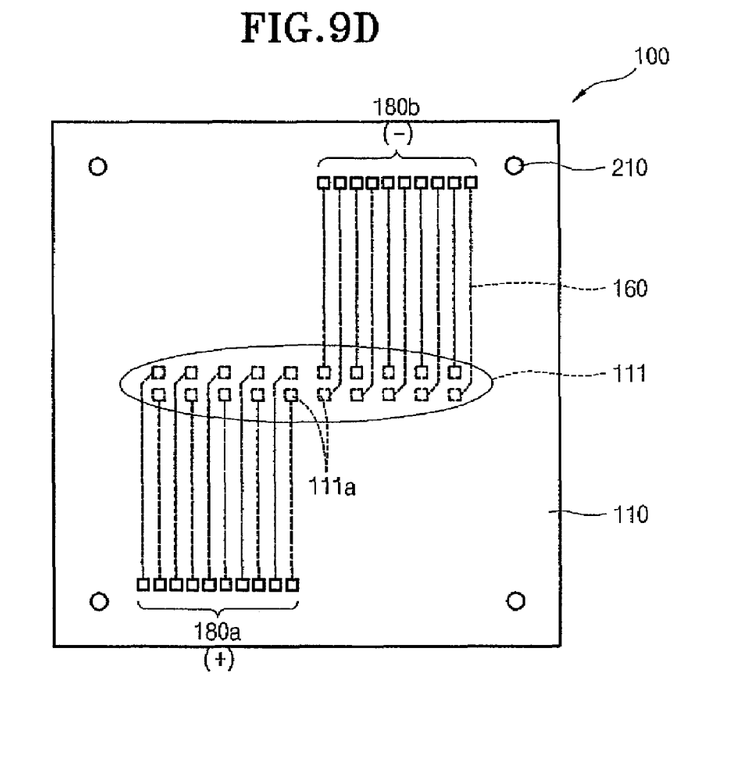

When four pad redistribution chips 100 are stacked on the substrate 300 in FIG. 7, for example, and the center pads 111 of the first pad redistribution chip 100 stacked on the substrate 300 are positioned in Y-axis direction, as shown in FIG. 9a. The center pads 111 of the second pad redistribution chip 100 are rotated 90° with respect to the first pad redistribution chip and positioned in X-axis direction, as shown in FIG. 9b. Likewise, the center pads 111 of the third pad redistribution chip 100 are rotated 90° with respect to the second pad redistribution chip and positioned in Y-axis direction, as shown in FIG. 9c. The enter pads 111 of the fourth pad redistribution chip 100 is rotated 90° with respect to the third pad redistribution chip and positioned in X-axis direction, as shown in FIG. 9d.

Although the center pads 111 shown in FIGS. 9a to 9d are arranged in the same manner as those of the pad redistribution chip 100 shown in FIG. 3, the pad redistribution chip 100 shown in FIG. 2 or 4 can be arranged in the same manner as described above.

More particularly, the center pads 111 of each of the stacked pad redistribution chips 100 belong to an odd-numbered (or even-numbered) layer are positioned in the same direction. The center pads 111 of any of the stacked pad redistribution chips 100 belonging to an odd-numbered layer are perpendicular to the center pads 111 of any of the stacked pad redistribution chips 100 belonging to an even-numbered layer, and vice versa.

The pad redistribution chips 100 have dummy bumps 210 formed on four corners thereof, respectively, to provide a space among them when stacked on one another.

An anisotropic dielectric film 400 is positioned in each space among the pad redistribution chips 100 to electrically connect the substrate 300 to the pad redistribution chips 100.

The anisotropic dielectric film 400 has an L-shaped configuration with contact pads 410 positioned on its vertical and horizontal portions.

The anisotropic dielectric film 400 is attached to the corners of the pad redistribution chips 100 in such a manner that the contact pad 410 on its horizontal portion contacts the (+) and (−) edge pads 180 and its contact pad 410 on the vertical portion is coupled to the flexible PCB 500.

Figure 10A:
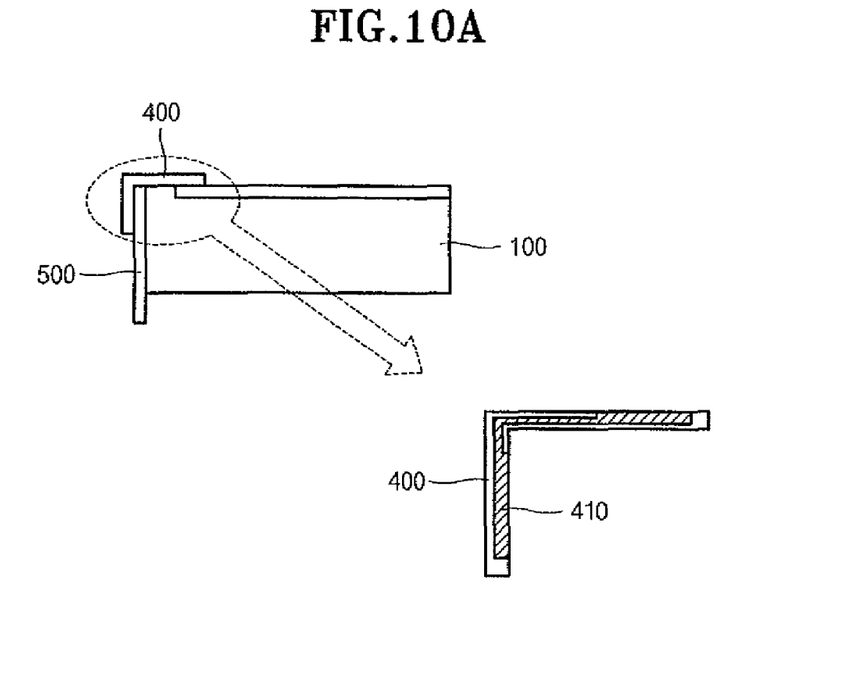
FIGS. 10a and 10b are lateral views showing the methods of coupling a flexible PCB and an anisotropic dielectric film to the pad redistribution chip shown in FIG. 7.
Figure 10B:
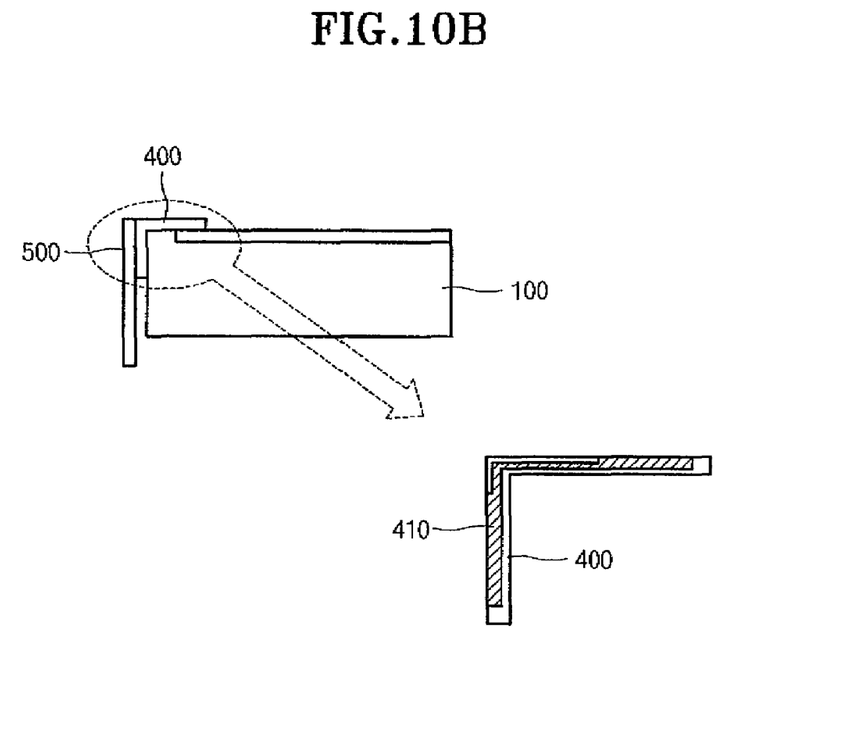

The flexible PCB 500 may be inserted and between the anisotropic dielectric film 400 and the pad redistribution chips 100, as shown in FIG. 10a. Alternatively, the flexible PCB 500 may be coupled to the exterior of the anisotropic dielectric film 400 after interposing anisotropic dielectric film 400 between the flexible PCB 500 and the pad redistribution chips 100.

The flexible PCB 500 is coupled to a half of the four lateral surfaces of the stacked pad redistribution chips 100, on which the edge pads 180 are positioned. For example, when four pad redistribution chips 100 are stacked on one another, the flexible PCB 500 is alternately coupled to the third and fourth chips 100 from four directions.

This is for the purpose of electrically connecting the edge pads 180 of the first and third of the stacked pad redistribution chips 100, which overlap each other, and the edge pads 180 of the second and fourth pad redistribution chips 100, which are perpendicular to those of the first and third pad redistribution chips 100.

The anisotropic dielectric film 400 is coupled to the flexible PCB 500 in a thermal compression mode by means of foil (not shown) applied to the flexible PCB 500. In summary, the stacked package 700 has pad redistribution chips 100 stacked on one another, which have center pads 111 positioned at the center thereof and edge pads 180, a half of which is opposite to the other half thereof in the diagonal direction about the center pads 111. A flexible PCB 500 and an anisotropic dielectric film 400 are coupled to lateral surfaces of the substrate 300 and the pad redistribution chips 100 to electrically connect the substrate 300 to the pad redistribution chips 100. Therefore, the size of the stacked package 700 does not increase in either the vertical or horizontal direction in contrast to conventional stacked packages using wires. Hence, it can be used for compact electronic products.

As mentioned above, a pad redistribution chip, a method for manufacturing the same, and a stacked package using the same according to the present invention are advantageous in that the stacked package has a vertical or horizontal size smaller than that of conventional stacked packages using wires and are applicable to compact electronic products.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A stacked package comprising:
    a substrate;
    a number of stacked pad redistribution chips, each pad distribution chip comprising:
        a wafer, wherein a middle vertical line is referred to a line located substantially in the middle of the wafer, wherein a (+) direction is referred to as the direction perpendicular to and on the right side of the middle vertical line, wherein a (−) direction is referred to as the direction perpendicular to and on the left side of the middle vertical line, wherein four quadrants are present in the wafer such that two quadrants are present in each of the left (+) and right (−) side of the middle vertical line and such that all four quadrants meet at a middle point of the wafer;
        at lest one row of center pads formed on the wafer substantially along the middle vertical line;
        a row of (+) edge pads formed in one quadrant in the left (+) direction;
        a row of (−) edge pads formed in one quadrant in the right (−) direction such that the row of (−) edge pads and the row of (+) edge pads are diagonally symmetrical with respect to the middle point of the wafer; and
        a number of traces in each quadrant for electrically connecting each center pad to the corresponding one of the edge pads;
    wherein each pad distribution chip stacked on another pad distribution chip is rotated by 90 degrees with respect to the middle point of the wafer such that no two quadrants having the edge pads are stacked;
    a flexible PCB for electrically connecting the substrate to the pad redistribution chips; and
    an anisotropic dielectric film for electrically connecting the pad redistribution chips to the flexible PCB and the substrate to the flexible PCB.

2. The stacked package as claimed in claim 1, wherein the center pads of each of the stacked pad redistribution chips belonging to an odd-numbered layer have the same direction as the (±) edge pads.

3. The stacked package as claimed in claim 1, wherein the center pads of each of the stacked pad redistribution chips belonging to an odd-numbered layer are perpendicular to the center pads of each of the stacked pad redistribution chips belong to an even-numbered layer.

4. The stacked package as claimed in claim 1, wherein the anisotropic dielectric film has an L-shaped configuration with contact pads positioned on horizontal and vertical portions thereof, respectively.

5. The stacked package as claimed in claim 4, wherein the anisotropic dielectric film is attached to corners of the pad redistribution chips in such a manner that the contact pad on the horizontal portion contacts the (±) edge pads and the contact pad on the vertical portion is coupled to the flexible PCB.

6. The stacked package as claimed in claim 5, wherein coupling between the anisotropic dielectric film and the flexible PCB is based on thermal compression.

7. The stacked package as claimed in claim 4, wherein the contact pad on the horizontal portion of the anisotropic dielectric film contacts the (±) edge pads, and the contact pad on the vertical portion thereof is coupled to the flexible PCB, the flexible PCB being attached to lateral surfaces of the pad redistribution chips and interposed between the vertical portion and the pad redistribution chips.

8. The stacked package as claimed in claim 7, wherein coupling between the anisotropic dielectric film and the flexible PCB is based on thermal compression.

9. The stacked package as claimed in claim 1, further comprising dummy bump positioned between each of the stacked pad redistribution chips.

10. A stacked package comprising:
a substrate;
a first pad redistribution chip stacked on the substrate and having a number of center pads positioned in Y-axis direction, a number of (+) edge pads positioned on an end of the first pad redistribution chip while being connected to the center pads lying in (+) direction from a middle center pad located in the middle of the center pads, and a number of (−) edge pads positioned on the other end of the first pad redistribution chip while being connected to the center pads positioned in (−) direction from the middle center pad;
a second pad redistribution chip having the same structure as the first pad redistribution chip and stacked on the first pad redistribution chip after being rotated 90° relative to the first pad redistribution chip;
a third pad redistribution chip having the same structure as the first pad redistribution chip and stacked on the second pad redistribution chip after being rotated 90° relative to the second pad redistribution chip;
a fourth pad redistribution chip having the same structure as the first pad redistribution chip and stacked on the third pad redistribution chip after being rotated 90° relative to the third pad redistribution chip;
a flexible PCB for electrically connecting the first and third pad redistribution chips to the substrate, as well as the second and fourth pad redistribution chips to the substrate;
an anisotropic dielectric film interposed between the first, second, third, and fourth pad redistribution chips and the flexible PCB to electrically connect the first, second, third, and fourth pad redistribution chips to the flexible PCB; and
dummy bumps for providing a space between each of the stacked first, second, third, and fourth pad redistribution chips.

* * * * *